US009136095B2

(12) United States Patent
Mori et al.

(10) Patent No.: US 9,136,095 B2
(45) Date of Patent: Sep. 15, 2015

(54) METHOD FOR CONTROLLING PLASMA PROCESSING APPARATUS

(71) Applicant: Hitachi High-Technologies Corporation, Minato-ku, Tokyo (JP)

(72) Inventors: Masahito Mori, Tokyo (JP); Akira Hirata, Tokyo (JP); Koichi Yamamoto, Tokyo (JP); Takao Arase, Tokyo (JP)

(73) Assignee: Hitachi High-Technologies Coporation, Tokyo (JP)

( * ) Notice: Subject to any disclaimer, the term of this patent is extended or adjusted under 35 U.S.C. 154(b) by 0 days.

(21) Appl. No.: 14/177,251

(22) Filed: Feb. 11, 2014

(65) Prior Publication Data

US 2014/0225503 A1    Aug. 14, 2014

(30) Foreign Application Priority Data

Feb. 12, 2013 (JP) .................................. 2013-024207
May 29, 2013 (JP) .................................. 2013-112562

(51) Int. Cl.
*H01J 7/24* (2006.01)
*H01J 37/32* (2006.01)

(52) U.S. Cl.
CPC ..... *H01J 37/32183* (2013.01); *H01J 37/32091* (2013.01); *H01J 37/3299* (2013.01); *H01J 37/32926* (2013.01)

(58) Field of Classification Search
USPC ....................................... 315/111.21, 111.51
See application file for complete search history.

(56) References Cited

U.S. PATENT DOCUMENTS

| | | | | |
|---|---|---|---|---|
| 5,195,045 A | * | 3/1993 | Keane et al. ................. | 702/107 |
| 5,712,592 A | * | 1/1998 | Stimson et al. ............ | 330/124 R |
| 5,770,922 A | * | 6/1998 | Gerrish et al. ............. | 315/111.21 |
| 6,265,831 B1 | * | 7/2001 | Howald et al. ............ | 315/111.21 |
| 6,351,683 B1 | * | 2/2002 | Johnson et al. ................. | 700/121 |
| RE38,273 E | * | 10/2003 | Gerrish et al. ............. | 315/111.21 |
| 6,677,711 B2 | * | 1/2004 | MacGearailt ............. | 315/111.21 |
| 6,919,689 B2 | * | 7/2005 | Jafarian-Tehrani et al. ......................... | 315/111.71 |
| 7,084,832 B2 | * | 8/2006 | Pribyl ......................... | 343/866 |

(Continued)

FOREIGN PATENT DOCUMENTS

| | | |
|---|---|---|
| JP | 2006-066905 A | 3/2006 |
| JP | 2007-059567 A | 3/2007 |

(Continued)

OTHER PUBLICATIONS

STIC search report.*

(Continued)

*Primary Examiner* — Douglas W Owens
*Assistant Examiner* — Srinivas Sathiraju
(74) *Attorney, Agent, or Firm* — Miles & Stockbridge P.C.

(57) ABSTRACT

There is provided a method for controlling a plasma processing apparatus that eliminates a preliminary study on a resonance point while maintaining a low contamination and a high uniformity even in multi-step etching. In a method for controlling a plasma processing apparatus including the step of adjusting a radio frequency bias current carried to a counter antenna electrode, the method includes the steps of: setting a reactance of a variable element to an initial value; detecting a bias current carried to the counter antenna electrode; searching for a maximum value of the detected electric current; and adjusting a value of the reactance of the variable element from the maximum value to the set value and then fixing the value.

5 Claims, 12 Drawing Sheets

(56) References Cited

U.S. PATENT DOCUMENTS

| | | |
|---|---|---|
| 7,190,119 B2 * | 3/2007 | Patrick et al. ............ 315/111.21 |
| 7,645,357 B2 * | 1/2010 | Paterson et al. .......... 156/345.51 |
| 8,038,896 B2 * | 10/2011 | Ikegami et al. ................. 216/59 |
| 8,546,266 B2 * | 10/2013 | Mori et al. .................... 438/714 |
| 2006/0037704 A1 | 2/2006 | Iwata et al. |
| 2006/0048892 A1 * | 3/2006 | Arase et al. .............. 156/345.42 |
| 2007/0044716 A1 | 3/2007 | Tetsuka et al. |
| 2013/0228550 A1 * | 9/2013 | Mori et al. ...................... 216/61 |
| 2014/0102640 A1 * | 4/2014 | Yokogawa et al. ...... 156/345.29 |
| 2014/0225503 A1 * | 8/2014 | Mori et al. ............... 315/111.21 |

FOREIGN PATENT DOCUMENTS

| | | |
|---|---|---|
| JP | 2008-244146 A | 10/2008 |
| JP | 2011-082180 A | 4/2011 |

OTHER PUBLICATIONS

Office Action issued Jan. 19, 2015, in Korean Patent Application No. 10-2014-0013325.

* cited by examiner

METHOD FOR CONTROLLING PLASMA PROCESSING APPARATUS

CLAIM OF PRIORITY

This application is based upon and claims the benefit of priority from the prior Japanese Patent Application No. 2013-024207, filed Feb. 12, 2013, and Application No. 2013-112562, filed May 29, 2013, the entire contents of which is incorporated herein by reference.

BACKGROUND OF THE INVENTION

1. Field of the Invention

The present invention relates to a method for controlling a parallel plate plasma processing apparatus that manufactures semiconductor devices and Micro Electro Mechanical System (MEMS) devices.

2. Description of the Related Art

For micro-fabrication of grooves in a space width of 10 nm and aspect of 15 or more on stacked films such as silicon, silicon oxidize, and silicon nitride, micro-fabrication is performed mainly using a parallel plate plasma processing apparatus that generates plasma in a region sandwiched between an upper electrode and a lower electrode. For the parallel plate plasma source, a capacitive coupling plasma (CCP) apparatus is used as well as a magnetic field VHF plasma apparatus is used including a supply for a VHF wave of 200 MHz and a magnetic field generating coil.

This magnetic field VHF plasma apparatus has a structure below. The upper electrode of the magnetic field VHF plasma apparatus includes a function of emitting VHF waves for plasma generation. For an upper electrode member, a dielectric ceramic material such as silica, yttria, and sapphire glass or a material that an aluminum material or stainless steel material is coated with a dielectric ceramic material is used for a surface contacting plasma, from viewpoints of contamination and foreign substances. Moreover, the plasma generation distribution and the in-plane distribution of the etching rate can be controlled using a magnetic field from a magnetic field generating coil. A radio frequency bias can be applied to the lower electrode on which a wafer is placed for anisotropy etching. See Japanese Patent Application Laid-Open Publication No. 2007-59567.

On the other hand, in the CCP etching apparatus, a plasma processing apparatus is disclosed for improving uniformity, which includes a circuit that adjusts electrical characteristics (impedance) on the counter electrode side on which a bias frequency is applied so as to prevent an electric current flowing into the counter electrode side from becoming the maximum. See Japanese Patent Application Laid-Open Publication No. 2011-82180, which discloses a control method in which a bias current is adjusted to a half of the maximum electric current or more.

SUMMARY OF THE INVENTION

In order to perform highly uniform etching with much less contamination using a magnetic field VHF plasma etching apparatus including a dielectric ceramic on the upper electrode, the inventors conducted control described in Japanese Patent Application Laid-Open Publication No. 2011-82180 in which a counter bias control mechanism is mounted on the upper electrode side, including a resonance coil that cancels reactance caused by the electrostatic capacitance of the dielectric ceramic and a variable capacitance. As a result, it was revealed that the following problems arise in that in the case where a multi-layer film is etched in multiple steps, the etching conditions are varied in the individual steps, and thus the magnitude of the variable capacitance to resonate and the absolute value of a counter bias current are changed, and in that when a preliminary study is conducted before processing as the measures for these changes, CoO is increased due to the use of a dummy wafer and a preparation is prolonged until processing time, for example.

Moreover, it was revealed that in the case of using control described in Japanese Patent Application Laid-Open Publication No. 2011-82180 in an end point determination step, since the counter bias current and the resonating reactance themselves are changed in the step, the bias current value goes out of the resonance point in the midway point of the change, the plasma distribution is changed, and the in-plane distribution of the substrate error selection ratio is degraded.

A first object of the present invention is to provide a method for controlling a plasma processing apparatus that eliminates a preliminary study on a resonance point while maintaining a low contamination and a high uniformity even in multi-step etching. Moreover, a second object of the present invention is to provide a method for controlling a plasma processing apparatus that follows changes in the resonance point or changes near the set resonance point and enables highly uniform etching of a multi-layer film even in a so-called transient state in which a counter bias current or plasma impedance is changed in an ignition step, an end point determination step, and other steps.

In order to solve the problems, configurations and process procedures described in the appended claims, for example, are adopted.

The present specification includes a plurality of means for solving the problems. One example is a method for controlling a plasma processing apparatus including a plasma processing chamber configured to plasma-process an object to be processed, a first flat electrode configured to emit a radio frequency into the plasma processing chamber, a first radio frequency power supply configured to supply radio frequency power to the first electrode, a second electrode opposite to the first electrode and on which the object to be processed is placed, a second radio frequency power supply configured to supply radio frequency power to the second electrode, and a control mechanism configured to control a radio frequency current carried through the first electrode or a radio frequency voltage applied to the first electrode, the method including: a first step of setting a reactance of a variable element included in the control mechanism to an initial value; a second step of detecting the radio frequency current or the radio frequency voltage; and a third step of setting the reactance of the variable element to a reactance value so that the radio frequency current takes a maximum value or the radio frequency voltage takes a maximum value and fixing the reactance of the variable element to the set reactance value.

Moreover, another example is a method for controlling a plasma processing apparatus including a plasma processing chamber configured to plasma-process an object to be processed, a first flat electrode configured to emit a radio frequency into the plasma processing chamber, a first radio frequency power supply configured to supply radio frequency power to the first electrode, a second electrode opposite to the first electrode and on which the object to be processed is placed, a second radio frequency power supply configured to supply radio frequency power to the second electrode, and a control mechanism configured to control a radio frequency current carried through the first electrode or a radio frequency voltage applied to the first electrode, the method including: a first step of detecting a phase difference between a radio frequency current carried through the second electrode and a radio frequency current carried through the first electrode or a phase difference between a radio frequency voltage applied to the second electrode and a radio frequency voltage applied to the first electrode; and a second step of controlling a reactance of a variable element included in the control mechanism so that the detected phase difference takes a phase difference value matched with a maximum value of the radio frequency current carried through the first electrode or a maximum value of the radio frequency voltage applied to the first electrode.

According to the present invention, it is possible to provide a method for controlling a plasma processing apparatus that eliminates a preliminary study on a resonance point while maintaining a low contamination and a high uniformity even in multi-step etching.

Moreover, it is possible to provide a method for controlling a plasma processing apparatus that follows changes in the resonance point or changes near the set resonance point and enables highly uniform etching of a multi-layer film even in a so-called transient state in which a counter bias current or plasma impedance is changed in an ignition step, an end point determination step, and other steps.

BRIEF DESCRIPTION OF THE DRAWINGS

The present invention will become fully understood from the detailed description given hereinafter and the accompanying drawings, wherein.

DETAILED DESCRIPTION OF THE PREFERRED EMBODIMENTS

First Embodiment

Figure 1:
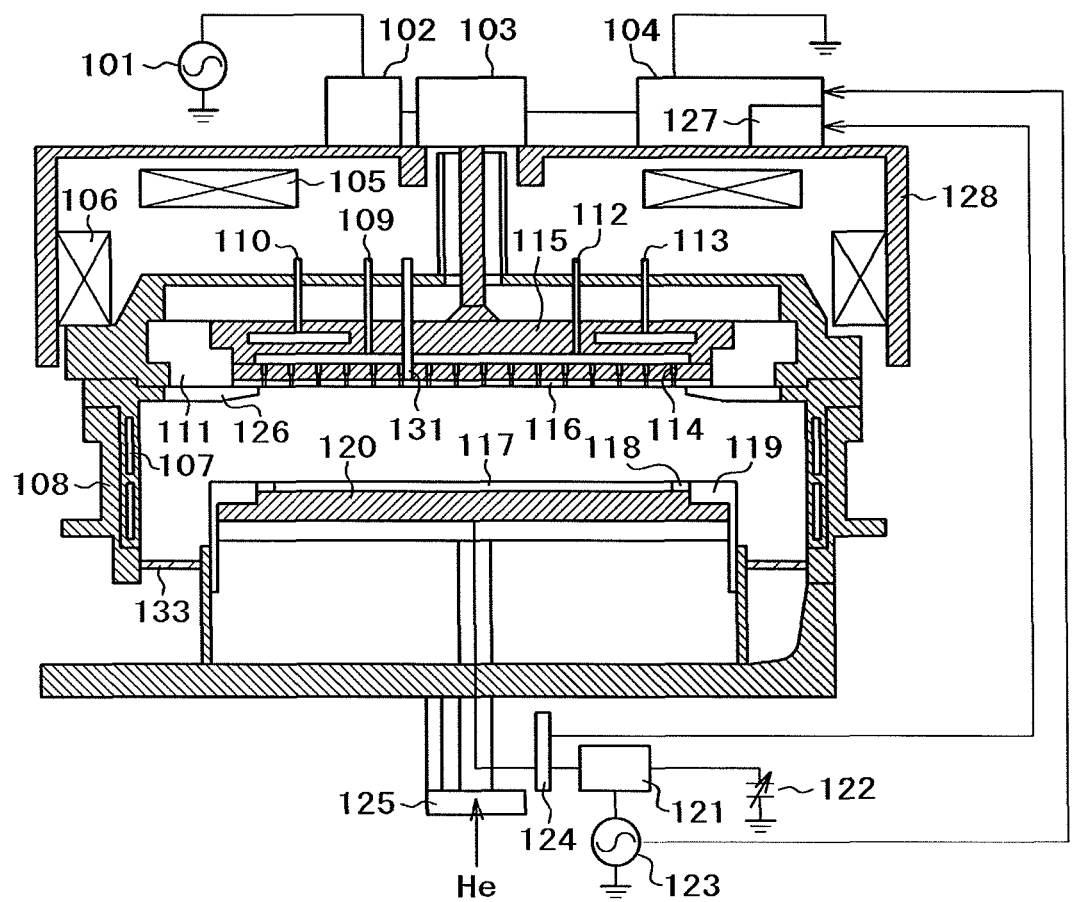
FIG. 1 is a schematic cross sectional view of the overall structure of a dry etching apparatus (a magnetic field VHF dry etching apparatus) for use in performing a method for controlling a plasma processing apparatus according to a first embodiment of the present invention.

A first embodiment of the present invention will be described with reference to FIGS. 1 to 4. First, a plasma processing apparatus mounted with a counter bias control mechanism that embodies a bias current control method in a method for controlling a plasma processing apparatus according to the embodiment will be described. FIG. 1 is a vertical cross sectional view of a parallel plate magnetic field VHF dry etching apparatus.

A vacuum container of the dry etching apparatus includes an etching chamber 108 for a plasma processing chamber, an earth internal cylinder 107, a silica top plate 111, a VHF radiation antenna 115, a vacuum pump, and a pressure control valve (both of them are not illustrated in FIG. 1).

Etching gases pass through a mass flow controller and a stop valve (both of them are not illustrated in FIG. 1), and pass through a gas inlet port A 109 and a gas inlet port B 112. The gases are distributed while preventing the gases from being mixed with each other using a gas distribution plate 114, and introduced from regions of a shower plate 116 concentrically divided into two parts into the etching chamber. The gases thus introduced are dissociated from each other by energy of electromagnetic waves applied from a plasma generating unit, and plasma is generated and maintained.

This plasma generating unit includes a source power supply 101 of a VHF wave of 200 MHz, a source electromagnetic wave matching unit 102, and a magnetic field generating unit formed of an electromagnet A 105 and an electromagnet B 106. These two electromagnets are used to uniformize the plasma generation distribution. The generated magnetic field is at 10 mT or less near the shower plate 116. VHF waves oscillated from the source power supply 101 pass through the source electromagnetic wave matching unit 102, and are introduced into the VHF radiation antenna 115 at a position opposite to a wafer stage 120. The VHF radiation antenna 115 is electrically isolated from the etching chamber 108 using the silica top plate 111.

An Si wafer (an object to be processed) 117 is placed on the wafer stage 120, including a stack of etched materials and mask materials such as a silicon oxide film, silicon nitride film, Poly-Si (polysilicon) film, resist film, anti-reflective film, TiN film, tungsten film, Ta compound film, and Hf oxide film. The wafer stage 120 includes a focus ring 118 and a susceptor 119 in a ring shape disposed as covering the outer circumferential side and the side wall of the surface on which the Si wafer 117 is placed. The wafer stage 120 can control a plurality of portions on the wafer stage 120 at different predetermined temperatures using a plurality of temperature control units, for example, (not illustrated in FIG. 1). The wafer stage 120 applies a direct current voltage ranging from −2,000 to +2,000 V generated using an electrostatic chuck (ESC) direct current power supply 122 to electrostatically chuck the Si wafer 117 in etching processing, fills He of an excellent heat transfer efficiency in a gap between the Si wafer 117 and the wafer stage 120, and controls the back surface pressure of the Si wafer 117. For the shower plate 116, silica or yttria was used, which have corrosion resistance against gasses and do not cause foreign substance emission. Since the shower plate 116 is in intimate contact with the gas distribution plate 114 and the VHF radiation antenna 115 using screws, for example, an excessive temperature increase can be suppressed by adjusting the temperature of a cooling medium for the VHF radiation antenna 115.

The wafer stage 120 is connected to an RF bias matching unit 121 and to a 4-MHz RF bias power supply 123 that leads ions from plasma to the Si wafer 117 and controls ion energy.

Such an RF bias power supply including a time modulation (sometimes denoted as TM) function was used for the RF bias power supply 123, in which power can be outputted in a range of about one watt at the lowest to about two kilowatts at the maximum equivalent to the emission of continuous sine waves to an object to be processed in a diameter of 12 inches and on-off modulation is performed in a range of one hertz to ten kilohertz in order to obtain the effects of a reduction in charge up damage (electron shading) and improved vertical processability.

A radio frequency bias current applied to the wafer stage 120 propagates through the inside of plasma toward the earth internal cylinder 107 disposed as an earth on the inner wall of the etching chamber 108 through a plasma sheath on the Si wafer 117. For the earth internal cylinder 107, such a conductive material is used as a conductive material of a low contamination or as a conductive material including a thermal sprayed material of a low reactivity with etching plasma through which a radio frequency passes, in order to reduce contamination in the apparatus and foreign substances.

In the parallel plate magnetic field VHF etching apparatus, in the embodiment, a counter bias control mechanism 104 is mounted through a filter unit 103 in order that a bias is transmitted to the VHF radiation antenna 115 side opposite to the wafer stage 120 to control the degree of confinement of the bias electric field for improving etching uniformity. The filter unit 103 includes a highpass filter (HPF) that prevents an RF bias of 4 MHz and the third-order harmonic of the RF bias from passing on the source power supply side and a lowpass filter (LPF) that flows only an RF bias frequency to the earth side. It is noted that a reference numeral 110 denotes a cooling medium inlet, a reference numeral 113 denotes a cooling medium outlet, a reference numeral 124 denotes a radio frequency bias current detecting unit, a reference numeral 125 denotes a wafer stage elevating mechanism, a reference numeral 126 denotes a silica ring, a reference numeral 127 denotes a resonance control circuit, a reference numeral 128 denotes a yoke, a reference numeral 131 denotes an EPD (End Point Detector) window, and a reference numeral 133 denotes a shield plate.

Figure 2:
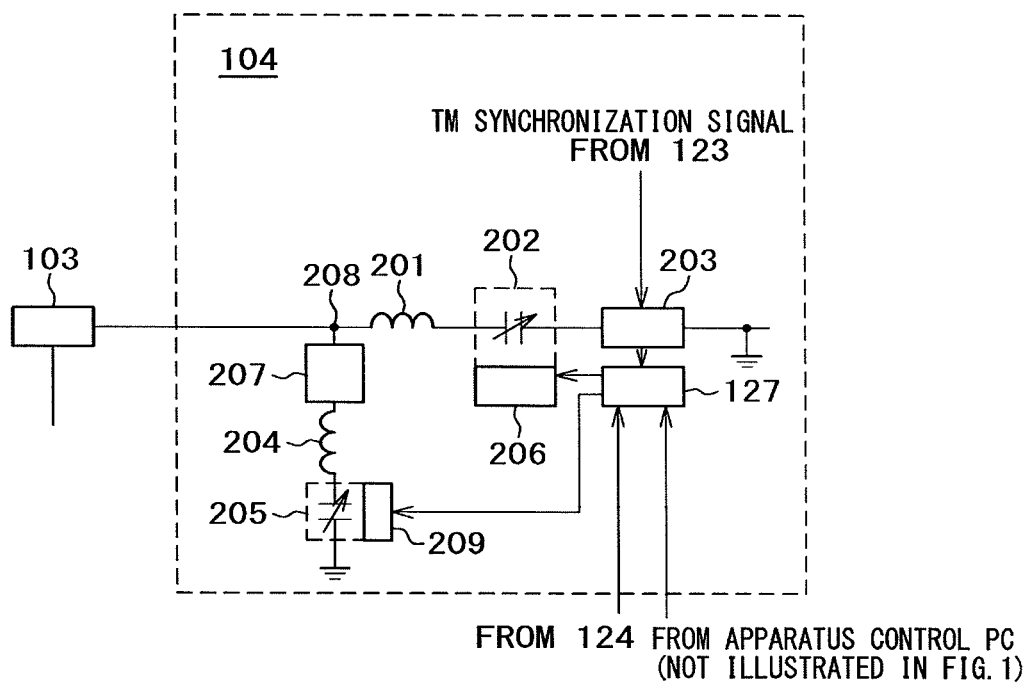
FIG. 2 is a circuit block diagram of a counter bias control mechanism of the dry etching apparatus illustrated in FIG. 1.

FIG. 2 is a diagram of the configuration of the counter bias control mechanism 104. The counter bias control mechanism 104 is configured of a serial resonant portion formed of a resonant coil 201 of low resistance that hardly generates heat even at the maximum electric current at an RF bias of 4 MHz and a variable capacitor 202 having a moderate withstand voltage, a counter bias current detecting circuit 203, and a resonance control circuit 127. In consideration of the electrostatic capacitance ($C_{sp}$) of the silica shower plate 116 and the electrostatic capacitance ($C_{sh}$) of a sheath formed on the shower plate, the inductance (L) of the resonant coil 201 and the electrostatic capacitance ($C_v$) of the variable capacitor 202 are selected using the relationship between Equations (1) to (3).

$$X_V = \omega L - \frac{1}{\omega}\left(\frac{1}{C_{Sh}} + \frac{1}{C_{sp}}\right) \quad (1)$$

Here, ω is the angular velocity of the RF bias frequency. $X_v$ is in the relationship in Equation (2) where the capacitance is $C_v$ in the case where the variable reactance element is a capacitor, whereas $X_v$ is in the relationship in Equation (3) where the inductance is $L_v$ in the case where the variable reactance element is a coil.

$$X_V = \omega L - \frac{1}{\omega}\left(\frac{1}{C_{Sh}} + \frac{1}{C_{sp}} + \frac{1}{C_v}\right) \quad (2)$$

$$X_V = \omega(L_V + L) - \frac{1}{\omega}\left(\frac{1}{C_{Sh}} + \frac{1}{C_{sp}}\right) \quad (3)$$

Moreover, a plurality of sets of a harmonic short circuit coil 204 and a harmonic short circuit fine tune capacitor 205 according to the harmonic order is inserted in parallel with a circuit formed of the resonant coil 201 and the variable capacitor 202, and the impedance of a harmonic component generated when passing through the plasma sheath on the VHF radiation antenna 115 can also be reduced, so that etching can be uniformized for wider plasma conditions. Furthermore, the electric current values of a plurality of harmonic components are monitored using a harmonic current detection circuit 207, so that information about the plasma density and the electron temperature can be obtained as well, and a change in the state of the apparatus can be detected more accurately. It is noted that a reference numeral 206 denotes an automatic matching unit, and a reference numeral 209 denotes an automatic harmonic matching unit.

Figure 3:
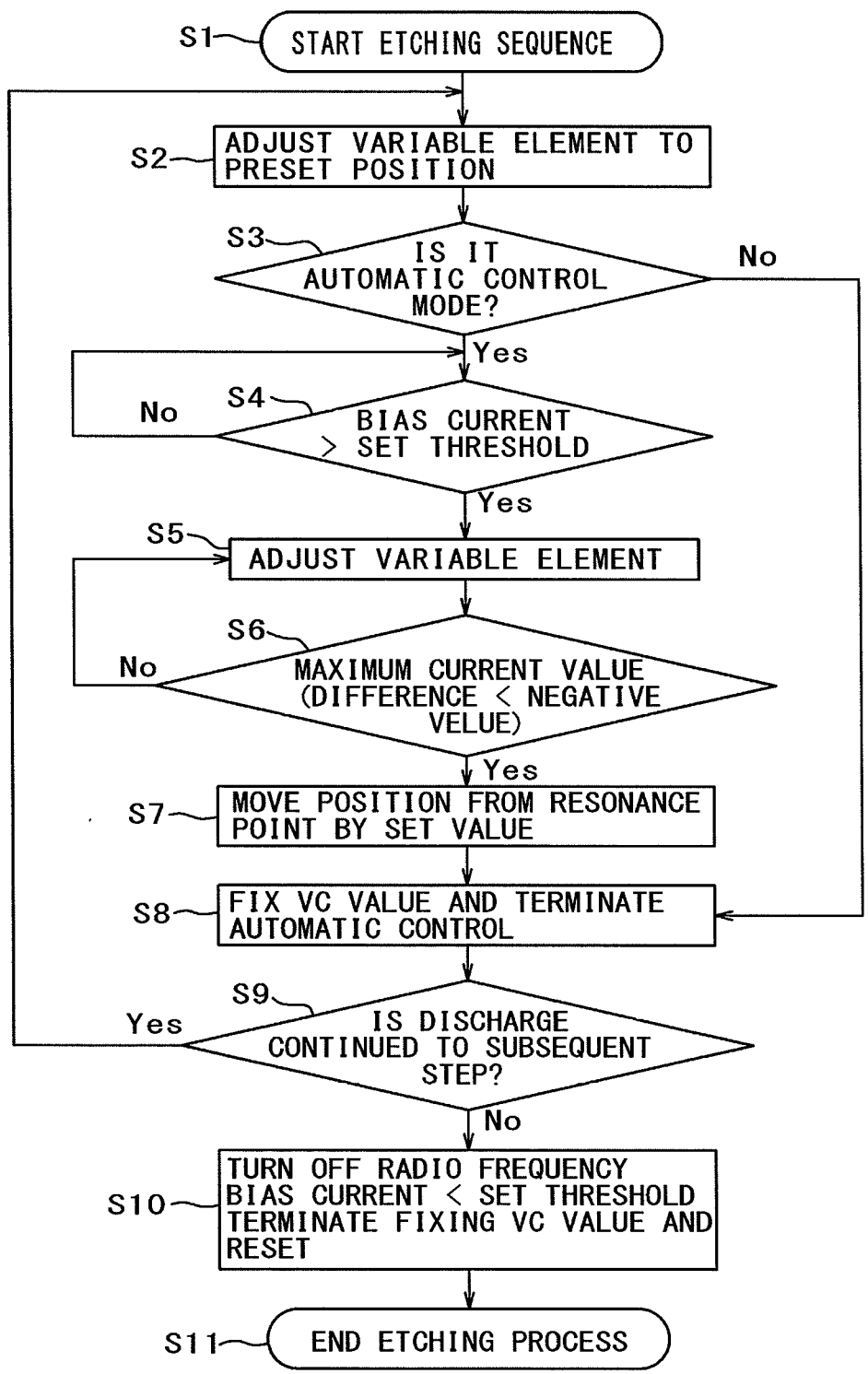
FIG. 3 is a flowchart for explaining control of the method for controlling a plasma processing apparatus according to the first embodiment of the present invention.
Figure 4:
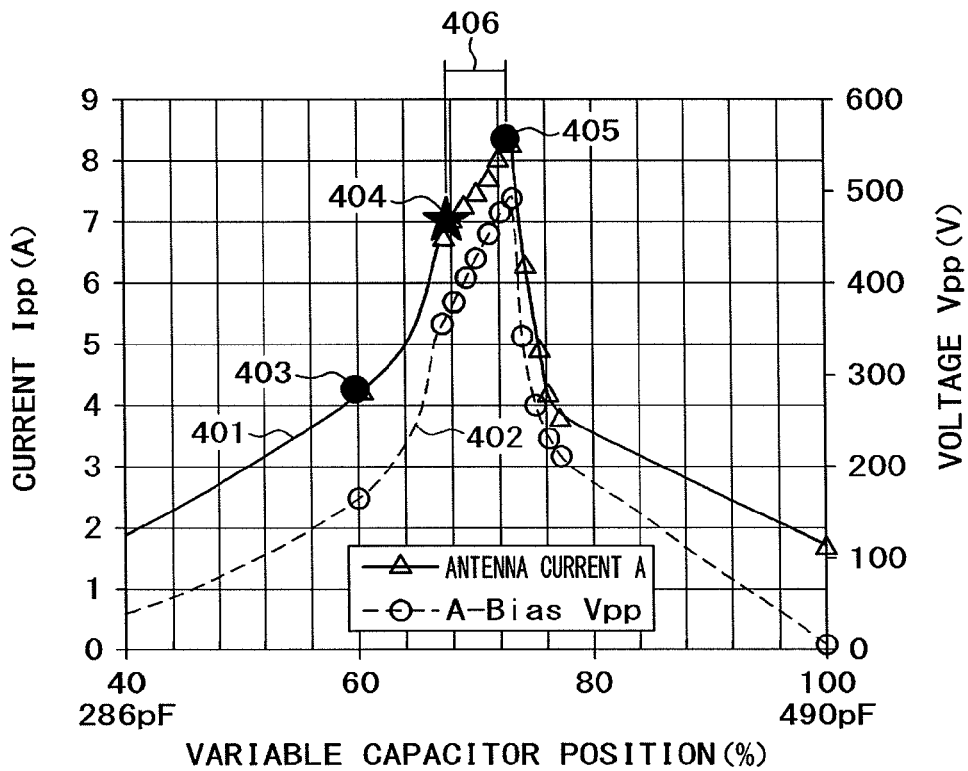
FIG. 4 is a graph of the dependence of a counter bias current on a variable capacitance in the dry etching apparatus illustrated in FIG. 1.

The embodiment relates to a bias current control method using the counter bias control mechanism 104 disposed on the parallel plate plasma processing apparatus thus configured. FIG. 3 is a control flow for explaining a bias current control method of a method for controlling a plasma processing apparatus according to the embodiment. Moreover, FIG. 4 is the dependence of the counter bias current on the variable capacitor capacitance. When the etching sequence is started (S1), an apparatus control PC sends signals of a preset position 403 and a target delta value 406 for the variable capacitor (the variable element) 202 to the resonance control circuit 127, and the variable capacitor 202 is adjusted to the preset position (S2). At this time, in the case where the apparatus control PC does not instruct the automatic control mode, the variable capacitor 202 is fixed at the preset position 403 in etching. On the other hand, in the case where the apparatus control PC instructs the automatic control mode, the RF bias power supply 123 outputs power (S3). Automatic control is then started from a point at which the antenna bias current exceeds a threshold at the counter bias current detecting circuit 203 (S4), and the variable element 202 starts the operation toward a resonance point 405 (S5).

FIG. 4 is measured data of a typical tendency of the counter bias current showing manners of the counter bias current and the variable capacitance. It is shown that since the point at which the bias current becomes the maximum is the resonance point, the counter bias current value takes the maximum value with respect to the capacitance of the variable capacitor 202. Moreover, the capacitance of the variable capacitor at the maximum value and the maximum value of the counter bias current are changed in the range of about 50 pF when the electrical capacitance ($C_{sh}$) of the sheath formed on the shower plate is changed, that is, when the plasma conditions (the output power of the source power supply 101, the processing pressure, and the power of the RF bias power supply 123, for example) are changed. Furthermore, when the electrostatic capacitance becomes greater than that at the resonance point, the bias current is suddenly reduced, and the etching rate distribution is similarly suddenly degraded as well. Thus, preferably, automatic control is started as the electrostatic capacitance at the preset position 403 is set lower than that at the resonance point 405. It is noted that a reference numeral 401 denotes the peak-to-peak current of the counter bias, and a reference numeral 404 denotes a counter bias current value when automatic control is finished.

Therefore, in the embodiment, the preset position 403 is selected at which the electrostatic capacitance is smaller than the electrostatic capacitance at the resonance point 405 (greater as reactance) and the bias current is a threshold current or more in starting. When the bias current exceeds the set threshold (S4), the resonance control circuit 127 changes the capacitance of the variable capacitor in the direction in which the bias current is increased. The electrostatic capacitance position at which the bias current is turned into a reduction is stored as the resonance capacitance (S6), the capacitance is moved from the position to the capacitance by the set target delta value 406 (S7), and the capacitance is fixed at the position in etching processing (S8). After that, the radio frequency bias is turned off, the capacitance of the variable capacitor 202 is reset when the counter bias current is lower than the set threshold (S10), and a series of the operations is finished (S11).

The description above is the operation in the first step in which plasma discharge is intermitted in every step. In the case where the etching conditions are changed as plasma discharge is continued, the variable capacitor 202 is fixed, and automatic matching is finished (S8), and a trigger signal outputted at the timing at which the process goes to the subsequent step is then received from the apparatus control PC (S9). In the case where discharge is continued, the variable element is adjusted to the preset value in the in the subsequent step (S2), and the automatic control flow is again started in the midway point. In the restarting, the preset value in the step in which discharge is continued is set to a value smaller than the capacitance of the variable capacitor at the resonance point, so that it is possible to improve the degradation of uniformity and stability after discharge is continued.

Moreover, in the application of the TM bias, the repetition frequency for turning on and off is synchronized with the timing of detecting the counter bias current in the counter bias current detecting circuit 203 for control only using values when turned on, so that automatic control is made possible.

According to the embodiment, in the parallel plate plasma apparatus using a dielectric material such as silica for the shower plate, even in the case where the etching process configured of multiple steps under plasma conditions different from each other and the application of the conditions are performed for a first time, it is possible to eliminate the necessity of studying the maximum values of the resonance point and the bias current in advance, to reduce malfunctions caused by changing the processing condition, to shorten turn around time (TAT), and to improve the reproducibility of uniformity. At this time, when the initial value of the variable capacitor 202 is set to a value of the capacitance smaller than the resonating capacitance, automatic control can be performed without degrading uniformity in searching for the resonance point.

As described above, the embodiment is described in which the counter bias current detecting circuit 203 detects the counter bias current for automatic control. However, also in the case of monitoring the voltage across the earth and the point on the passage through which the counter bias current passes (a reference numeral 208 in FIG. 2, for example) or monitoring the voltage across the resonant coil 201, the behaviors of a peak-to-peak voltage 402 of the counter bias and the variable capacitor 202 are identical to the behavior of the counter bias current as illustrated in FIG. 4. Therefore, similar control can be performed even though the counter bias voltage value is used for the monitor signal.

Moreover, it may be fine that an impedance monitor is inserted between the point 208 and the resonant coil 201 in FIG. 2 and the variable capacitor 202 is controlled based on the detected impedance information. In this case, it may be fine that the point at which the reactance that is an imaginary component of the impedance is zero is searched instead of searching for the maximum value of the bias current. In the application of the TM bias, control can be performed in which the impedance monitor is synchronized with the timing at which the bias current is turned on for control using the impedance when the bias current is turned on.

The case is described in the control flowchart of FIG. 3 where the trigger to start automatic matching is the timing at which the bias current exceeds the threshold. However, when the trigger is changed to a trigger signal outputted from the etching apparatus side, automatic control can be started after finishing the high transient phenomenon of the startup of the power supply, for example, so that malfunctions caused by the transient phenomenon in ignition can be suppressed. Similarly, when it is permitted to separately set waiting time until starting the operation after the trigger signal is inputted from the apparatus side or after the bias current exceeds the threshold also in the counter bias control mechanism, the apparatus can meet all the process conditions.

Also for the method for controlling the harmonic short circuit fine tune capacitor 205, similar control is performed as the bias of the principal component using the monitor result at the harmonic current detection circuit 207 and the automatic harmonic matching unit 209, so that the uniformity can be further improved.

Second Embodiment

A second embodiment of the present invention will be described with reference to FIGS. 5 to 7. It is noted that points described in the first embodiment but not described in the second embodiment can also be applied to the second embodiment unless otherwise specified.

In the embodiment, an embodiment will be described below in which even in the case where an electrostatic capacitance to resonate with a bias current changes in the steps such as the end point determination step, the changes can be followed. In order to implement the embodiment, in addition to monitoring a counter bias current, a radio frequency bias current detecting unit 124 detects phase information about a radio frequency bias current, and inputs the information to a resonance control circuit 127.

In this operation, a counter bias current detecting circuit 203 also acquires phase information about the counter bias current, and inputs the information to the resonance control circuit 127. The resonance control circuit 127 calculates the difference between the phase of the counter bias current and the phase of the radio frequency bias current oscillated in plasma, and controls the variable capacitance based on the result.

Figure 5:
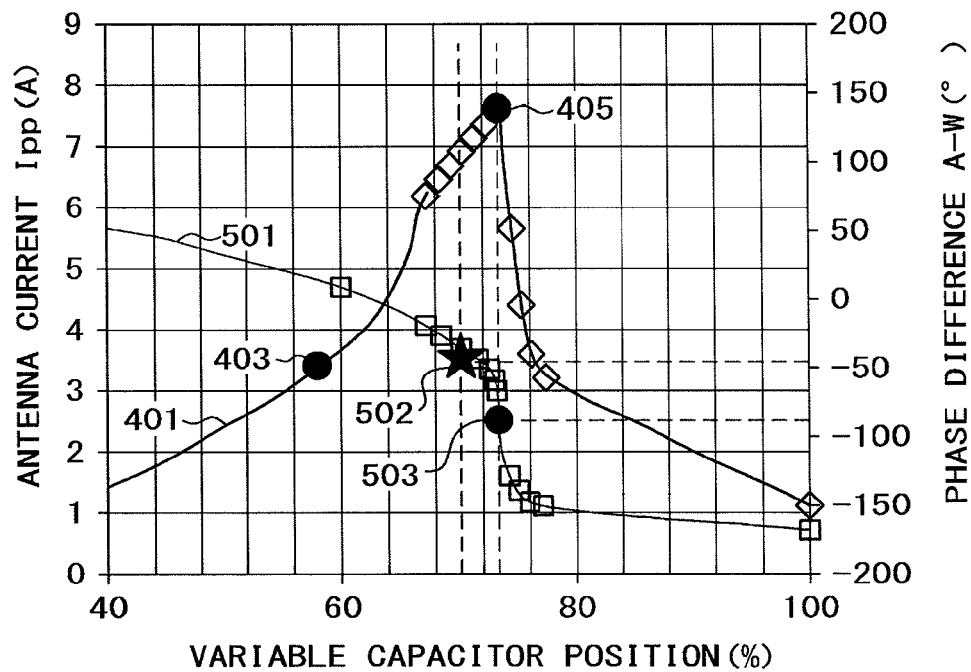
FIG. 5 is a graph of the dependence of the phase difference between a counter bias current and a radio frequency bias current on a variable capacitance in the dry etching apparatus illustrated in FIG. 1.

FIG. 5 is a graph of the dependence of the phase difference between the counter bias current and the radio frequency bias current on the variable capacitance. It was newly discovered that the position at which the bias current becomes the maximum is the position at which the phase difference is at an angle of −90°. Since it is known by experiment that this phase difference is constant regardless of plasma conditions, the monitor value of this phase difference is controlled so as to be matched with the target value, and transient changes can be followed as well. It is noted that a reference numeral 501 denotes the peak-to-peak current of the counter bias, and a reference numeral 503 denotes a phase difference in resonance.

Figure 6:
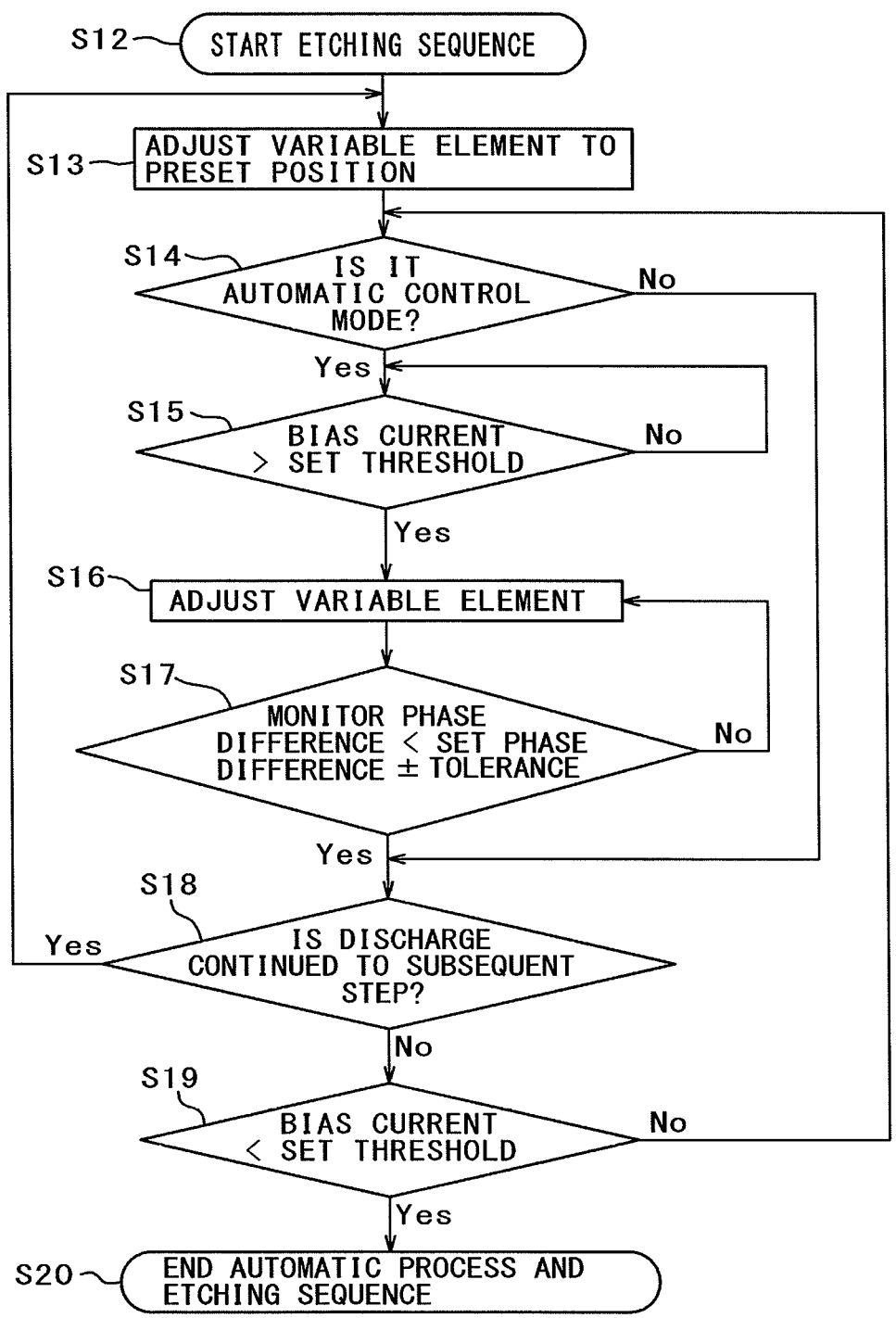
FIG. 6 is a flowchart for explaining control of a method for controlling a plasma processing apparatus according to a second embodiment of the present invention.
Figure 7:
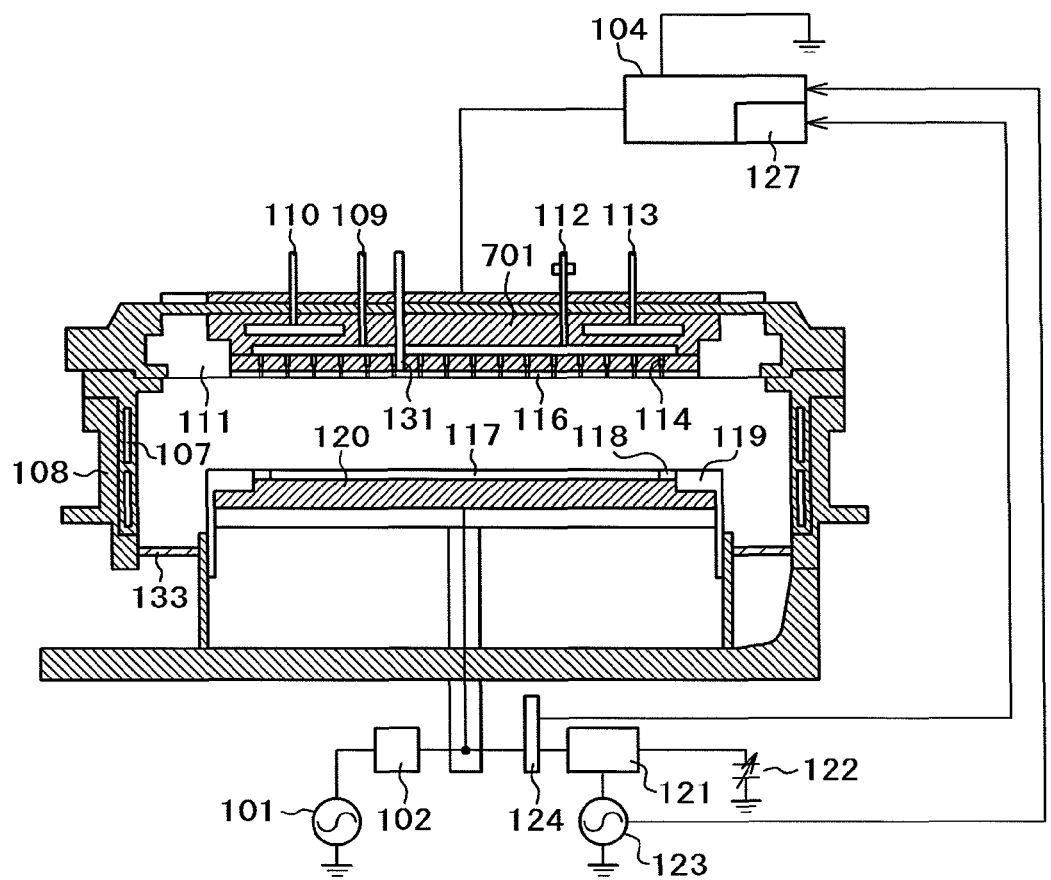
FIG. 7 is a schematic cross sectional view of the overall structure of another dry etching apparatus (a CCP etching apparatus) for performing the method for controlling a plasma processing apparatus according to the first and second embodiments of the present invention.

FIG. 6 is a flowchart of phase difference detection according to the embodiment based on this principle. The process is as described in the first embodiment until starting automatic control (Steps S12 to S14 correspond to Steps S1 to S3).

When a bias current is detached to start control (S15), a variable capacitor 202 is adjusted for the phase difference set on the etching apparatus side based on the relationship in FIG. 5 (S16). At this time, it is necessary to place a preset position 403 within −80 pF from the resonance point. This is because the phase difference is always reduced as the capacitance of the variable capacitor is increased in the region in which the preset position is placed within 80 pF.

According to the relationship illustrated in FIG. 5, in the case where the monitored phase difference is smaller than the permitted value of the set value, the variable capacitor 202 is reduced, whereas in the case where the monitored phase difference is greater than a set value 502, the variable capacitor 202 is increased. The capacitance of the variable capacitor 202 is then changed in such a way that the monitor value falls within the permitted value of the set value (S17).

In this control, as similar to the case of the first embodiment, since the capacitance smaller than the capacitance at a resonance point 405 has a small amount of change in uniformity for the phase difference at the set value 502, the phase difference is set greater than that at the point at an angle of −90°, which can provide more stable performance against a variation over time, for example. Subsequently, in Step 18 (S18), it is confirmed whether to continue discharge in the subsequent step. In the case where it is necessary to continue discharge in the subsequent step, the process is returned to Step 13 (S13). In the case where it is unnecessary to continue discharge in the subsequent step, it is confirmed whether the bias current is smaller than the set threshold in Step 19 (S19). In the case where the bias current is greater than the set threshold, the process is returned to Step 14 (S14). In the case where the bias current is smaller than the set threshold, the process is finished (S20).

As described above, according to the embodiment using phase difference detection, it is possible to directly reach the target value without exceeding the absolute value of a counter bias current or the variable capacitance of resonance, which are varied depending on the plasma conditions, and to automatically follow changes in the bias resonance point and the resonance position (the plasma impedance) as in determining the end point. It is noted that the method is also applicable to multistep etching.

It is noted that as similar to the first embodiment, the control method is similar when control is performed not only by the phase difference between the bias currents but also by the phase difference between the bias voltages. However, the phase difference at the resonance point is changed depending on the position of the voltage to be measured, and the phase difference is not always at an angle of −90°, so that it is necessary to check phase differences in advance according to the configuration of an apparatus for use.

As described above, for the method descried in the first and second embodiments, the example is described in which the source power supply 101 at 200 MHz and the RF bias power supply of magnetic field VHF plasma at 4 MHz are mounted. However, the method is also applicable to a parallel plate apparatus (a so-called CCP apparatus) with no magnetic field as illustrated in FIG. 7. The apparatus in FIG. 7 is configured in which a source power supply 101 is connected on the wafer stage side and a shower plate 116 to be the surface of a counter earth electrode 701 is formed of a dielectric material. The method is similarly applicable by connecting a counter bias control mechanism 104 for a source power supply on the counter earth electrode 701 side.

Third Embodiment

Figure 8:
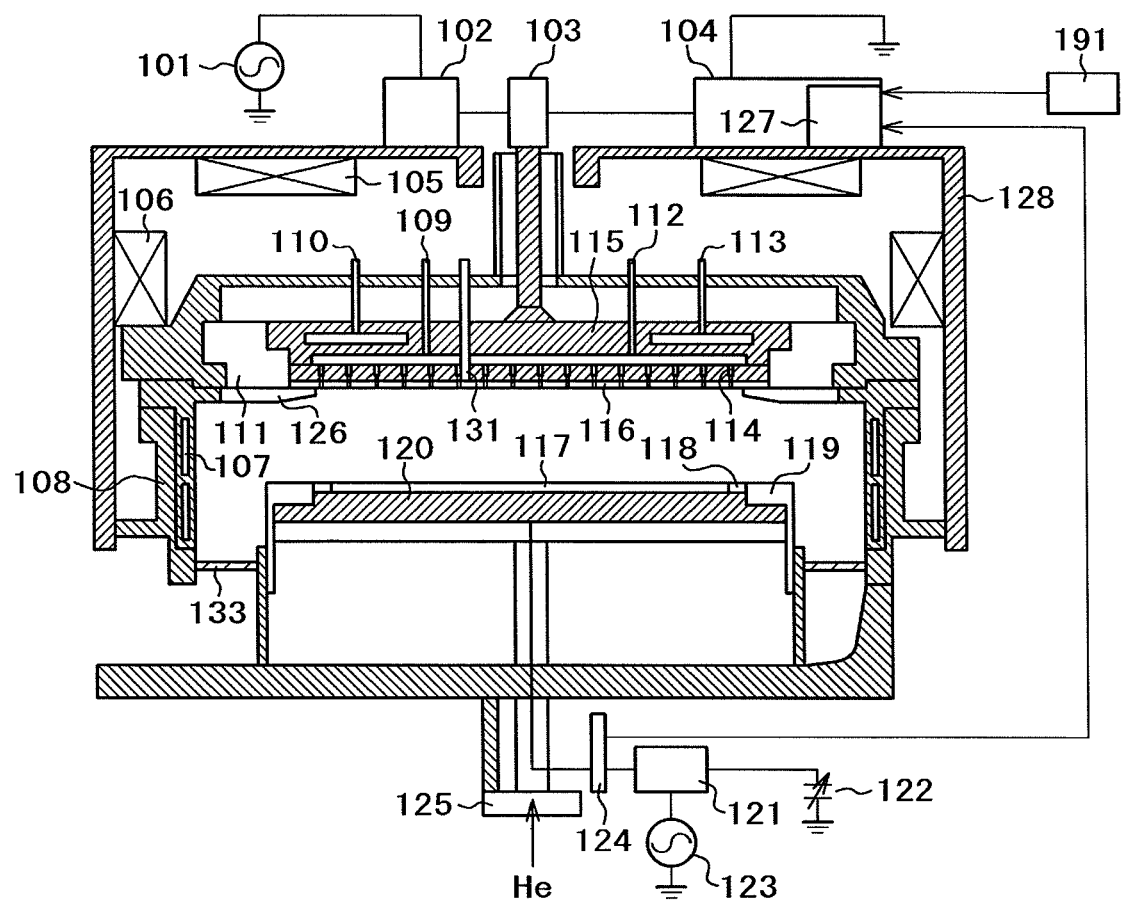
FIG. 8 is a schematic cross sectional view of the overall structure of a dry etching apparatus (a magnetic field VHF dry etching apparatus) for use in performing a plasma processing method according to a third embodiment of the present invention.

A third embodiment of the present invention will be described with reference to FIGS. 8 to 15. It is noted that points described in the first or second embodiment but not described in the third embodiment can also be applied to the third embodiment unless otherwise specified. First, a plasma processing apparatus mounted with a counter bias control mechanism that embodies a cleaning method of a plasma processing method according to the embodiment will be described. FIG. 8 is a vertical cross sectional view of a parallel plate magnetic field VHF dry etching apparatus.

A vacuum container of the dry etching apparatus includes an etching chamber 108 for a plasma processing chamber, an earth internal cylinder 107, a silica top plate 111, a VHF radiation antenna 115, a vacuum pump, and a pressure control valve (both of them are not illustrated in FIG. 8).

Etching gases pass through a mass flow controller and a stop valve (both of them are not illustrated in FIG. 8), and pass through a gas inlet port A 109 and a gas inlet port B 112. The gases are distributed while preventing the gases from being mixed using a gas distribution plate 114, and introduced from regions of a shower plate 116 concentrically divided into two parts into the etching chamber. The gases thus introduced are dissociated from each other by energy of electromagnetic waves applied from a plasma generating unit, and plasma is generated and maintained.

This plasma generating unit includes a source power supply 101 of a VHF wave of 200 MHz, a source electromagnetic wave matching unit 102, and a magnetic field generating unit formed of an electromagnet A 105 and an electromagnet B 106. These two electromagnets are used to uniformize the plasma generation distribution. The generated magnetic field is at 10 mT or less near the shower plate 116. VHF waves oscillated from the source power supply 101 pass through the source electromagnetic wave matching unit 102, and are introduced into the VHF radiation antenna 115 at a position opposite to a wafer stage 120. The VHF radiation antenna 115 is electrically isolated from the etching chamber 108 using the silica top plate 111.

An Si wafer 117 is placed on the wafer stage 120, including a stack of etched materials and mask materials such as a silicon oxide film, silicon nitride film, Poly-Si (polysilicon) film, resist film, anti-reflective film, TiN film, tungsten film, Ta compound film, and Hf oxide film. The wafer stage 120 includes a focus ring 118 and a susceptor 119 in a ring shape disposed as covering the outer circumferential side and the side wall of the surface on which the Si wafer 117 is placed. The wafer stage 120 can control a plurality of portions on the wafer stage 120 at different predetermined temperatures using a plurality of temperature control units, for example, (not illustrated in FIG. 8). The wafer stage 120 applies a direct current voltage ranging from −2,000 to +2,000 V generated using an electrostatic chuck (ESC) direct current power supply 122 to electrostatically chuck the Si wafer 117 in etching processing, fills He of an excellent heat transfer efficiency in a gap between the Si wafer 117 and the wafer stage 120, and controls the back surface pressure of the Si wafer 117. For the shower plate 116, silica, sapphire, or yttria was used, which have corrosion resistance against gasses and do not cause foreign substance emission. Since the shower plate 116 is in intimate contact with the gas distribution plate 114 and the VHF radiation antenna 115 using screws, for example, an excessive temperature increase can be suppressed by adjusting the temperature of a cooling medium for the VHF radiation antenna 115.

The wafer stage 120 is connected to an RF bias matching unit 121 and to a 4-MHz RF bias power supply 123 that leads ions from plasma to the Si wafer 117 and controls ion energy.

Such an RF bias power supply including a time modulation (sometimes denoted as TM) function was used for the RF bias power supply 123, in which power can be outputted in a range of about one watt at the lowest to about four kilowatts at the maximum equivalent to the emission of continuous sine waves to an object to be processed in a diameter of 12 inches and on-off modulation is performed in a range of one hertz to ten kilohertz in order to obtain the effects of a reduction in charge up damage (electron shading) and improved vertical processability.

A radio frequency bias current applied to the wafer stage 120 propagates through the inside of plasma toward the earth internal cylinder 107 disposed as an earth on the inner wall of the etching chamber 108 through a plasma sheath on the Si wafer 117. For the earth internal cylinder 107, such a conductive material is used as a conductive material of a low contamination or as a conductive material including a thermal sprayed material of a low reactivity with etching plasma through which a radio frequency passes, in order to reduce contamination in the apparatus and foreign substances.

In the parallel plate magnetic field VHF etching apparatus, in the embodiment, a counter bias control mechanism 104 is mounted through a filter unit 103 in order that a bias is transmitted to the VHF radiation antenna 115 side opposite to the wafer stage 120 to control the degree of confinement of the bias electric field for improving etching uniformity. The filter unit 103 includes a highpass filter (HPF) that prevents an RF bias of 4 MHz and the third-order harmonic of the RF bias from passing on the source power supply side and a lowpass filter (LPF) that flows only an RF bias frequency to the earth side. It is noted that a reference numeral 110 denotes a cooling medium inlet, a reference numeral 113 denotes a cooling medium outlet, a reference numeral 124 denotes a radio frequency bias current detecting unit, a reference numeral 125 denotes a wafer stage elevating mechanism, a reference numeral 126 denotes a silica ring, a reference numeral 127 denotes a resonance control circuit, a reference numeral 128 denotes a yoke, a reference numeral 131 denotes an EPD (End Point Detector) window, and a reference numeral 133 denotes a shield plate. The radio frequency bias current detecting unit 124 may be disposed in the RF bias matching unit 121.

Figure 9:
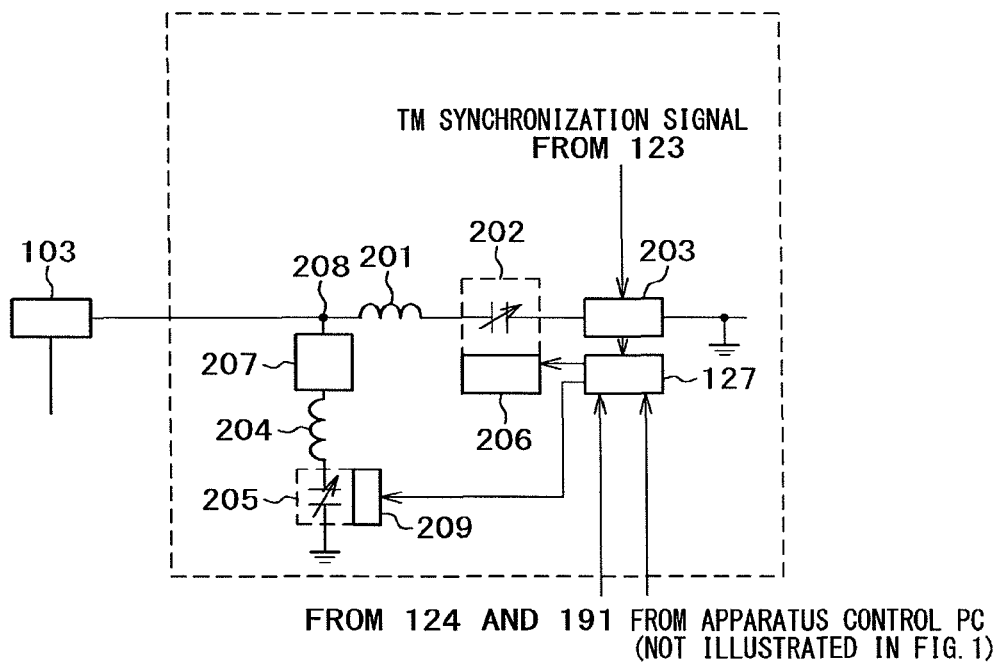
FIG. 9 is a circuit block diagram of a counter bias control mechanism of the dry etching apparatus illustrated in FIG. 8.

FIG. 9 is a diagram of the configuration of the counter bias control mechanism 104. The counter bias control mechanism 104 is configured of a serial resonant portion formed of a resonant coil 201 and a variable capacitor 202 having a moderate withstand voltage, a counter bias current detecting circuit 203, and a resonance control circuit 127. In consideration of the electrostatic capacitance ($C_{sp}$) of the silica shower plate 116 and the electrostatic capacitance ($C_{sh}$) of a sheath formed on the shower plate, the inductance (L) of the resonant coil 201 and the electrostatic capacitance ($C_v$) of the variable capacitor 202 are selected using the relationship between Equations (1) to (3) described in the first embodiment.

Moreover, a plurality of sets of a harmonic short circuit coil 204 and a harmonic short circuit fine tune capacitor 205 according to the harmonic order is inserted in parallel with a circuit formed of the resonant coil 201 and the variable capacitor 202, and the impedance of a harmonic component generated when passing through the plasma sheath on the VHF radiation antenna 115 can also be reduced, so that etching can be uniformized for wider plasma conditions. Furthermore, the electric current values of a plurality of harmonic components are monitored using a harmonic current detection circuit 207, so that information about the plasma density and the electron temperature can be obtained as well, and a change in the state of the apparatus can be detected more accurately. It is noted that a reference numeral 206 denotes an automatic matching unit, a reference numeral 208 denotes a voltage measurement point, and a reference numeral 209 denotes an automatic harmonic matching unit.

The embodiment relates to a plasma cleaning method using the counter bias control mechanism 104 disposed on the parallel plate plasma processing apparatus thus configured. Plasma cleaning is necessary for stabilizing mass production in the etching process in the process step of removing etching reaction products attached in the etching chamber in etching processing. Plasma cleaning is appropriately inserted between individual wafers or lots after the etching process.

For example, for a cleaning gas in etching Si using $Cl_2$ or HBr, such a gas is used that oxygen or nitrogen, for example, is mixed in a gas to supply fluorine such as $SF_6$, $NF_3$, and $CF_4$. For a cleaning gas in etching $SiO_2$ or SiN using a fluorocarbon gas, such a gas is used that $O_2$ or $N_2$ is mixed, or H is mixed in some case. For a cleaning gas in etching Al, Ti, or Hf, for example, a gas such as $Cl_2$, HCl, and HBr is used.

Figure 10:
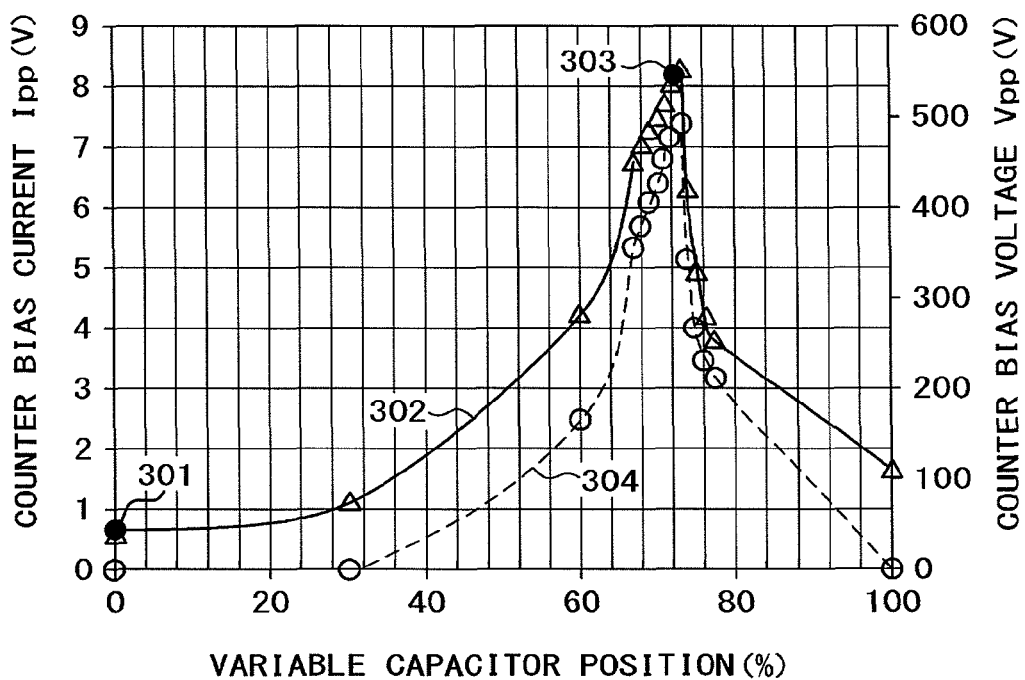
FIG. 10 is a graph of the dependence of a counter bias current on a variable capacitance in the dry etching apparatus illustrated in FIG. 8.

FIG. 10 is measured data that a change in a counter bias current Ipp 302 is measured at the counter bias current detecting circuit 203 when the electrostatic capacitance of the variable capacitor 202 in the counter bias control mechanism 104 is changed. It is shown that since the point at which the bias current becomes the maximum is the resonance point, the counter bias current value takes the maximum value with respect to the capacitance of the variable capacitor 202. Moreover, the capacitance of the variable capacitor at the maximum value and the maximum value of the counter bias current are changed in the range of about 50 pF when the electrical capacitance ($C_{sh}$) of the sheath formed on the shower plate is changed, that is, when the plasma conditions (the output power of the source power supply 101, the processing pressure, and the power of the RF bias power supply 123, for example) are changed. A reference numeral 301 denotes a dissonance point, and a reference numeral 303 denotes a resonance point. Furthermore, in a graph in FIG. 10, although a counter bias voltage Vpp 304 is also plotted at the voltage measurement point 208 in the counter bias control mechanism, the behavior is matched with the behavior of the counter bias current Ipp 302. Thus, in the following, the description will be given as the case where the counter bias voltage Vpp 304 is detected.

Figure 11:
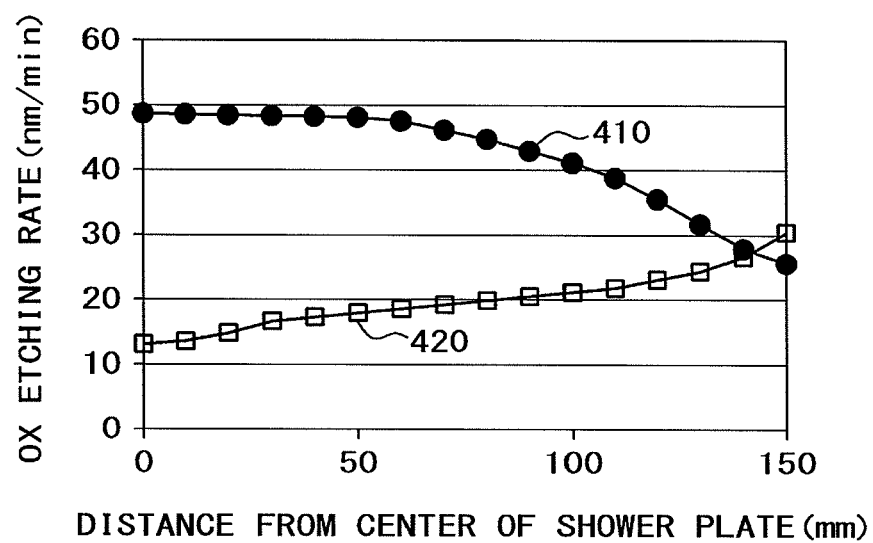
FIG. 11 is a graph of the in-plane distribution of the oxidization film etching rate on a shower plate when a counter bias control mechanism is resonating and not resonating in the dry etching apparatus illustrated in FIG. 8.

FIG. 11 is the in-plane distribution of the rate of an oxide film attached on the shower plate 116 when the counter bias control mechanism 104 is resonating (a reference numeral 410 in FIG. 11) and when the counter bias control mechanism 104 is not resonating (a reference numeral 420 in FIG. 11) where a $SF_6/O_2$ gas is at 8 Pa and the RF bias power is at 100 W. It was found that the etching rate of an oxide film in simulating the wearing out of the silica shower plate is about 20 nm/min in the plane on average in dissonance whereas the etching rate is increased twice or more at the resonance point as the oxide film rate is about 45 nm/min.

This is because the counter bias control mechanism 104 is resonated to reduce the reactance on the VHF radiation antenna 115 side, so that the ion current and the electron current are accelerated from plasma in the sheath and the currents flow in. With the use of this principle, the counter bias control mechanism 104 can be resonated in cleaning to cause an ion assist reaction on the silica shower plate 116, so that the cleaning rate can be dramatically improved.

Figure 12:
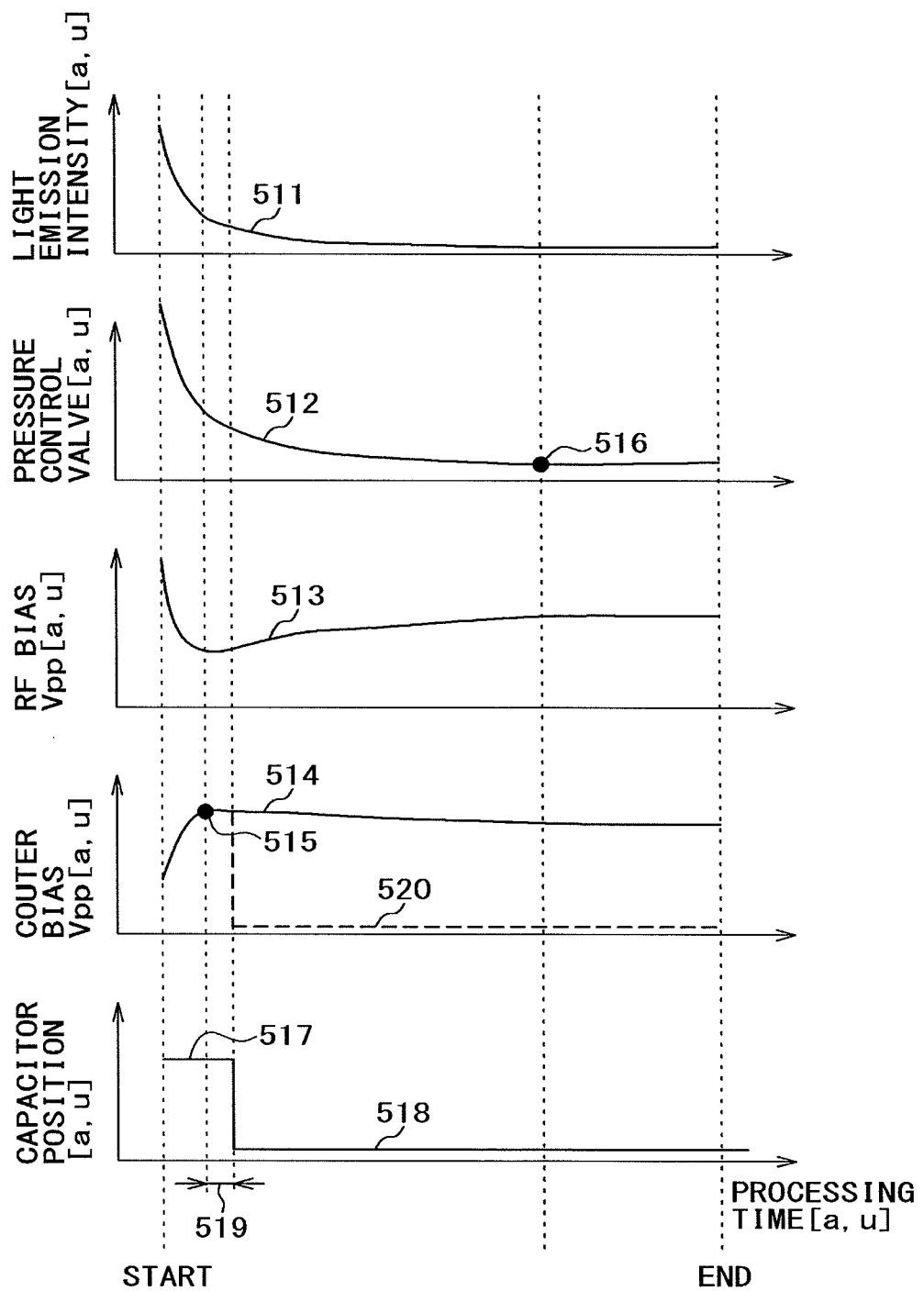
FIG. 12 is a time sequence of changes in monitor values in cleaning and the control of a variable capacitor in the dry etching apparatus illustrated in FIG. 8.

The timing chart of the cleaning method for the dry etching apparatus illustrated in FIG. 8 to which the present invention is applied will be described with reference to FIG. 12. FIG. 12 is a sequence chart of the measured results of the time variation of light emission intensity 511 at a wavelength of 440 nm measured through the EPD window 131, an opening degree 512 of the pressure control valve (not illustrated in FIG. 8), an RF bias voltage Vpp 513 detected at the RF bias matching unit 121, and a counter bias voltage Vpp 514 detected at the voltage measurement point 208 in the counter bias control mechanism under cleaning processing after etched using a fluorocarbon gas and the manner of control of the variable capacitor 202 in the counter bias control mechanism. The following is the cleaning conditions, where $O_2$ is at 800 ccm, a pressure is at 4 Pa, the output of the source power supply 101 is at 800 W, and the output of the RF bias power supply 123 is at 1,000 W.

When the plasma light emission intensity 511, the pressure control valve the position 512, or the control valve opening degree is fixed, which are previously existing means for detecting the cleaning end point, relatively long time constants are observed for a change in the pressure, the RF bias voltage Vpp 513, or the time variation of the plasma impedance detected on the RF bias side, whereas the time constant for the counter bias voltage Vpp 514 used in the present invention is short. This is because the cleaning end points are detected on the entire boundary contacting plasma in the previously existing detection method, whereas the time variation of the counter bias voltage Vpp 514 is short because the cleaning end point is detached on the boundary surface on the shower plate 116 side in the entire boundary.

Therefore, an end point 515 for removal of the attachment on the shower plate is determined at time at which the absolute value of the amount of change Vpp (A)–Vpp (B) in the counter bias voltage Vpp value between time A and time B becomes smaller than the set value for a specified number of times or more or determined at the inflection point of the counter bias voltage Vpp value (at the point at which the secondary difference of Vpp reaches zero). After a lapse of preset over cleaning time 519 from the timing, the capacitance of the variable capacitor 202 of the counter bias control mechanism 104 is adjusted from a variable capacitor position 517 in resonance to a position 518 for the variable capacitor in dissonance.

As a result of the control, the monitor value of the counter bias voltage Vpp is changed as a dotted line (a dotted line 520 in FIG. 12). With this manipulation, the conditions can be changed in such a way that the conditions in which the cleaning effect of the shower plate due to an ion assist reaction is maximized are first used and then the conditions in which the degree of the wearing out of the shower plate is reduced in an ion impact are used, so that it is possible to reduce the frequency of replacing the shower plate, which enables a reduction in CoC and the extension of MTBM. It is noted that a reference numeral 516 is the end point of chamber cleaning.

Although a larger amount of change from the resonance point to the dissonance point is preferable, this is varied depending on the dielectric constant and thickness of the shower plate 116 and the electrical passage from the VHF radiation antenna 115 to the counter bias control mechanism 104. In the embodiment, a change of 50 pF or more was sufficient.

Figure 13:
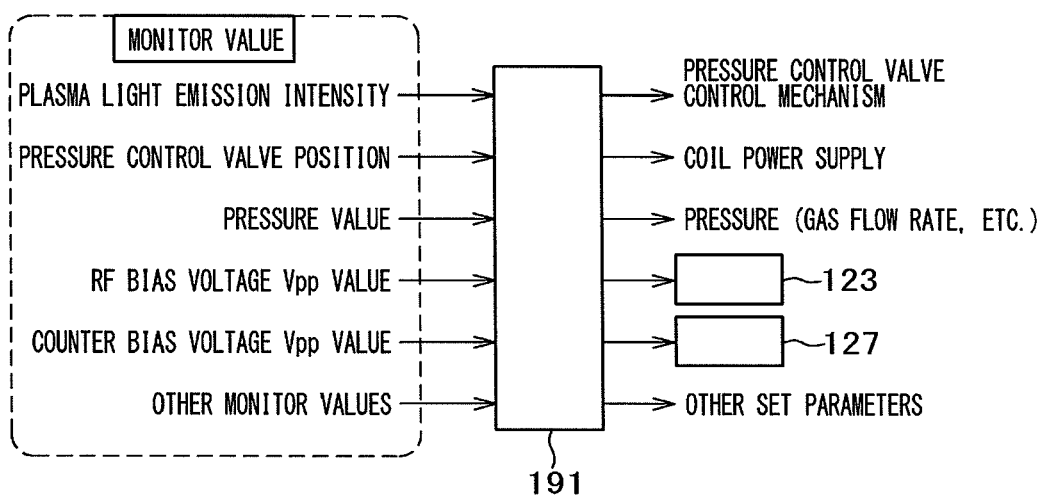
FIG. 13 is a block diagram of an end point determination circuit for plasma processing according to the third embodiment of the present invention.

The cleaning end point determination control like this is feasible using an end point determination circuit 191 illustrated in FIG. 13. In other words, in the control parameters monitored in etching or in cleaning, parameters sensitive to the time variation for cleaning are extracted (the monitored parameters in FIG. 12, for example), the monitor signal of the counter bias voltage Vpp is calculated as described above based on the signals of the monitored parameters, and the end point of the removal of the attachment on the shower plate is determined. The end point determination circuit 191 may be externally installed on a previously existing device, or can be implemented by changing control software for a previously existing device when monitor signals exist.

Figure 14:
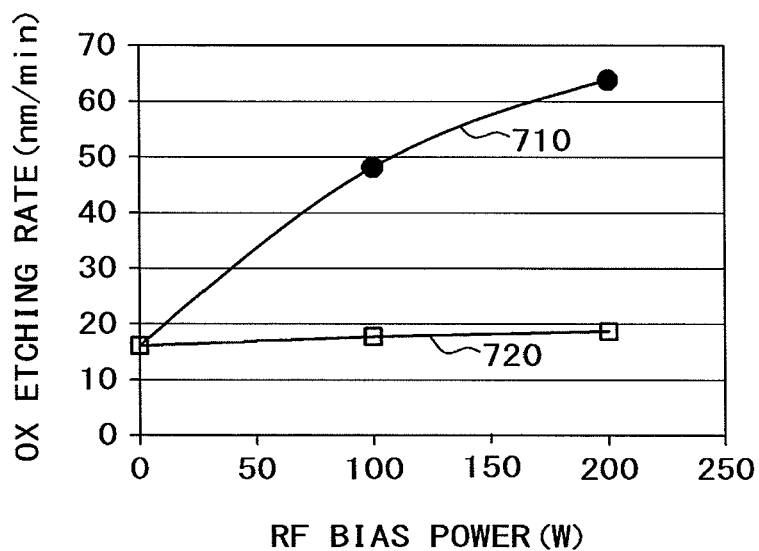
FIG. 14 is a graph of the dependence of the oxidization film etching rate on the RF bias power at the center point of the shower plate when the counter bias control mechanism is resonating and not resonating in the dry etching apparatus illustrated in FIG. 8.

FIG. 14 is a graph of the oxidization film etching rate in the center part of the shower plate when the RF bias power is changed in resonance (a reference numeral 710 in FIG. 14) and in dissonance (a reference numeral 720 in FIG. 14). In resonance, it is shown that the oxide film rate on the shower plate is almost linearly increased in association with an increase in the RF bias power. Therefore, the method for controlling ion energy on the shower plate can be implemented by resonating the counter bias control mechanism 104 to adjust the RF bias power. Only the RF bias power is adjusted, so that ion energy on the shower plate can be changed without operating the variable capacitor 202 of the counter bias control mechanism 104, which is advantageous to prolong the lifetime of the variable capacitor.

Moreover, the in-plane distribution of the cleaning rate on the shower plate is matched with the plasma distribution, so that control is feasible by resonating the counter bias control mechanism 104 to adjust the electric currents of the electromagnet A 105 and the electromagnet B 106. It may be possible that with the use of these characteristics, after determining the cleaning end point of the shower plate, the coil current or the RF bias power is changed for over cleaning for a certain time period to improve the efficiency of removal of the attachment on the surface.

The example in FIG. 12 shows the example in which the attachment tends to be removed as fluorocarbon attachments are removed using oxygen. In the case of removing $AlF_3$, $HfF_4$, and $TiO_2$, for example, an ion assist reaction is necessary. In the case of cleaning these compounds, a mixed gas is used in which a gas including reductive H or B (HCl and $BCl_3$, for example) that easily breaks coupling such as Al—F and Ti—O is mixed with a gas that increases the volatility of a reaction product with Al, Hf, and Ti in $Cl_2$, HBr, and $SiCl_4$, for example. The counter bias control mechanism 104 is then resonated to apply an RF bias of 100 W or more to an Si wafer, so that the attachment on the shower plate can be efficiently removed.

Figure 15:
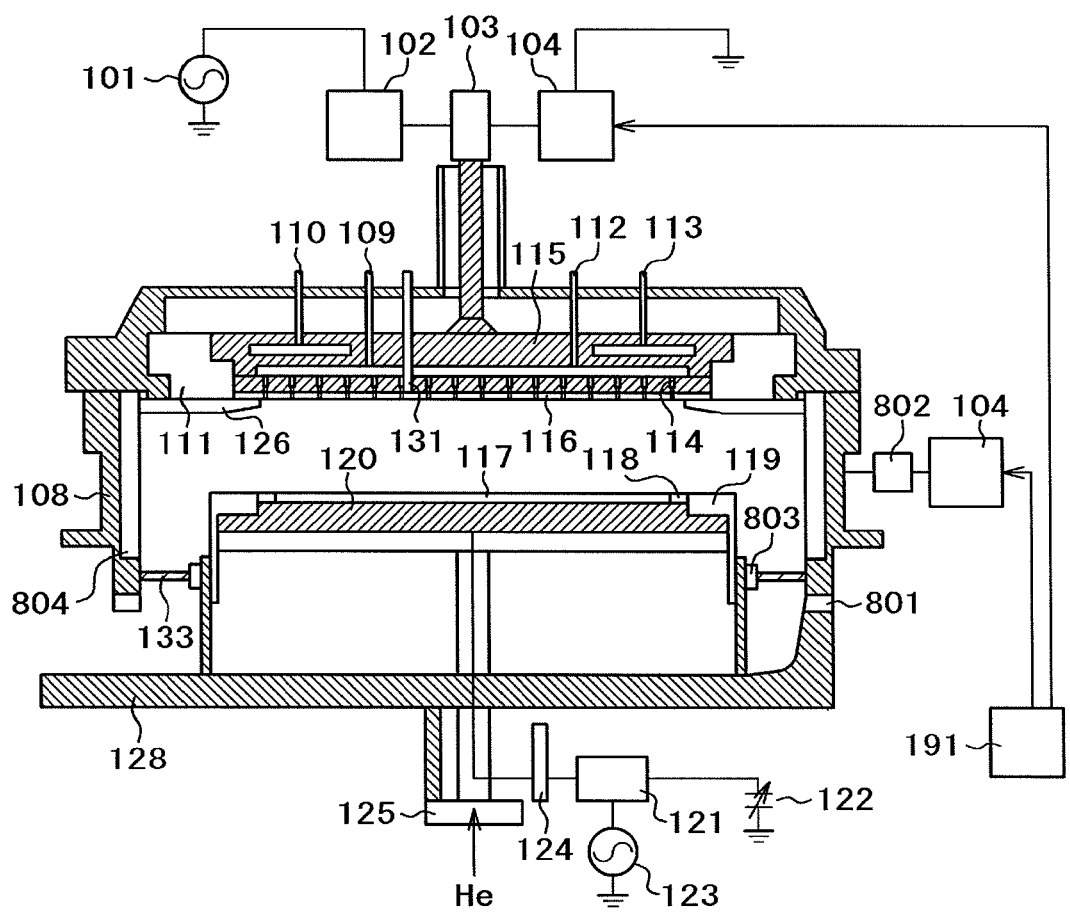
FIG. 15 is a cross sectional view of a dry etching apparatus with no electromagnet for performing another plasma processing method according to the third embodiment of the present invention.

In the embodiment, the magnetic field parallel plate etching apparatus including a dielectric in the upper electrode as illustrated in FIG. 8 is described. Similar effects can be obtained in cleaning a parallel plate etching apparatus with no magnetic field as illustrated in FIG. 15, in which the circuit constant of a counter bias control mechanism 104 is changed according to Equations (1) to (3) depending on the frequency of a source power supply 101 or an RF bias power supply 123 for use. The control of the cleaning distribution in this case is conducted using the power of the source power supply 101, the process pressure, and the power of the RF bias power supply 123.

Moreover, as illustrated in FIG. 15, the attachment on a silica internal cylinder 804 can be similarly cleaned in which an etching chamber 108 is electrically insulated from a base flange using an insulation ring A 801 and an insulation ring B 803, an RF bias current passes through a source frequency ground circuit 802 through the silica internal cylinder 804, and a counter bias control mechanism 104 controls the RF bias current connected to the etching chamber 108.

According to the embodiments as described above, it is possible to provide a plasma processing method that reduces the wearing out of the dielectric ceramic on the upper antenna side as in a CCP etching apparatus, for example, including the counter bias control mechanism and improves MTBM and CoC of the apparatus.

As described above, the invention of the present application is described in detail. The following is the main aspects of the present invention.

(1) A plasma processing method using a plasma processing apparatus including a plasma processing chamber configured to plasma-process an object to be processed, a first flat electrode configured to emit a radio frequency into the plasma processing chamber, a first radio frequency power supply configured to supply radio frequency power to the first electrode, a second electrode opposite to the first electrode and on which the object to be processed is placed, a second radio frequency power supply configured to supply radio frequency power to the second electrode, and a control mechanism configured to control a radio frequency current carried through the first electrode or a radio frequency voltage applied to the first electrode, the method including: a first step of setting a reactance of a variable element included in the control mechanism to an initial value; a second step of detecting the radio frequency current or the radio frequency voltage; a third step of setting the reactance of the variable element to a reactance value so that the radio frequency current takes a maximum value or the radio frequency voltage takes a maximum value and fixing the reactance of the variable element to the set reactance value; and a fourth step of plasma-processing the object to be processed.

(2) A plasma processing method using a plasma processing apparatus including a plasma processing chamber configured to plasma-process an object to be processed, a first flat electrode configured to emit a radio frequency into the plasma processing chamber, a first radio frequency power supply configured to supply radio frequency power to the first electrode, a second electrode opposite to the first electrode and on which the object to be processed is placed, a second radio frequency power supply configured to supply radio frequency power to the second electrode, and a control mechanism configured to control a radio frequency current carried through the first electrode or a radio frequency voltage applied to the first electrode, the method including: a first step of detecting a phase difference between a radio frequency current carried through the second electrode and a radio frequency current carried through the first electrode or a phase difference between a radio frequency voltage applied to the second electrode and a radio frequency voltage applied to the first electrode; a second step of controlling a reactance of a variable element included in the control mechanism so that the detected phase difference takes a phase difference value matched with a maximum value of the radio frequency current carried through the first electrode or a maximum value of the radio frequency voltage applied to the first electrode; and a third step of plasma-processing the object to be processed.

(3) A plasma processing method using a plasma processing apparatus including a plasma processing chamber configured to plasma-process an object to be processed, a first flat electrode configured to emit a radio frequency into the plasma processing chamber, a first radio frequency power supply configured to supply radio frequency power to the first electrode, a second electrode opposite to the first electrode and on which the object to be processed is placed, a second radio frequency power supply configured to supply radio frequency power to the second electrode, and a control mechanism configured to control a radio frequency current carried through the first electrode or a radio frequency voltage applied to the first electrode, the method including: a first step of setting a reactance of a variable element included in the control mechanism to an initial value; a second step of detecting the radio frequency current or the radio frequency voltage; a third step of setting the reactance of the variable element to a reactance value so that the radio frequency current takes a maximum value or the radio frequency voltage takes a maximum value and fixing the reactance of the variable element to the set reactance value; and a fourth step of plasma-cleaning the inside of the plasma processing chamber after the third step.

(4) A plasma processing method using a plasma processing apparatus including a plasma processing chamber configured to plasma-process an object to be processed, a first flat electrode configured to emit a radio frequency into the plasma processing chamber, a first radio frequency power supply configured to supply radio frequency power to the first electrode, a second electrode opposite to the first electrode and on which the object to be processed is placed, a second radio frequency power supply configured to supply radio frequency power to the second electrode, and a control mechanism configured to control a radio frequency current carried through the first electrode or a radio frequency voltage applied to the first electrode, the method including: a first step of detecting a phase difference between a radio frequency current carried through the second electrode and a radio frequency current carried through the first electrode or a phase difference between a radio frequency voltage applied to the second electrode and a radio frequency voltage applied to the first electrode; a second step of controlling a reactance of a variable element included in the control mechanism so that the detected phase difference takes a phase difference value matched with a maximum value of the radio frequency current carried through the first electrode or a maximum value of the radio frequency voltage applied to the first electrode; and a third step of plasma-cleaning the inside of the plasma processing chamber after the second step.

It is noted that the present invention is not limited to the foregoing embodiments, and includes various exemplary modifications. For example, the forging embodiments are described in detail for easily understanding the present invention. The present invention is not always limited to ones including all the described configurations. Moreover, a part of the configuration of an embodiment can be replaced by the configuration of another embodiment, and the configuration of another embodiment can be added to the configuration of an embodiment. Furthermore, a part of the configurations of the embodiments can be added with, deleted from, or replaced by the other configurations.

What is claimed is:

1. A method for controlling a plasma processing apparatus including a plasma processing chamber in which an object to be processed is plasma-processed, a first electrode which emits a radio frequency into the plasma processing chamber, a first radio frequency power supply which supplies radio frequency power to the first electrode, a second electrode arranged to face the first electrode and on which the object to be processed is placed, a second radio frequency power supply which supplies radio frequency power to the second electrode, the method comprising the steps of:
   detecting a radio frequency current flowing from the second electrode toward the first electrode or a radio frequency voltage on a path in which the radio frequency current flows; and
   controlling a reactance for controlling the detected radio frequency current or the detected radio frequency voltage so that the detected radio frequency current or the detected radio frequency voltage takes a value of the resonance point.

2. The method for controlling a plasma processing apparatus according to claim 1, wherein the initial value of the reactance is greater than the value of the resonance point so that the radio frequency current takes a maximum value or the radio frequency voltage takes a maximum value.

3. A method for controlling a plasma processing apparatus including a plasma processing chamber in which an object to be processed is plasma-processed, a first electrode which emits a radio frequency into the plasma processing chamber, a first radio frequency power supply which supplies radio frequency power to the first electrode, a second electrode arranged to face the first electrode and on which the object to be processed is placed, a second radio frequency power supply which supplies radio frequency power to the second electrode, the method comprising steps of:
   detecting a first phase difference between a first radio frequency current flowing from the second radio frequency power supply toward the second electrode and a second radio frequency current flowing from the second electrode toward the first electrode or a second phase difference between a first radio frequency voltage applied to the second electrode and a second radio frequency voltage on a path in which the second radio frequency current flows, and
   controlling a reactance for controlling the second radio frequency current or the second radio frequency voltage based on the detected first phase difference or the detected second phase difference.

4. The method for controlling a plasma processing apparatus according to claim 3, wherein the value of the first or second phase difference is a value within a desired permissible value with respect to an angle of 90 degrees.

5. The method for controlling a plasma processing apparatus according to claim 3, wherein the reactance is a variable capacitor.

* * * * *